United States Patent
Ren et al.

(10) Patent No.: US 9,252,766 B2
(45) Date of Patent: Feb. 2, 2016

(54) LOAD DETECTING CIRCUITS AND THE METHOD THEREOF

(75) Inventors: Yuancheng Ren, Hangzhou (CN); En Li, Hangzhou (CN); Naixing Kuang, Hangzhou (CN); Yike Li, Chengdu (CN)

(73) Assignee: Chengdu Monolithic Power Systems Co., Ltd., Chengdu (CN)

(*) Notice: Subject to any disclaimer, the term of this patent is extended or adjusted under 35 U.S.C. 154(b) by 437 days.

(21) Appl. No.: 13/538,843

(22) Filed: Jun. 29, 2012

(65) Prior Publication Data

US 2013/0082742 A1 Apr. 4, 2013

(30) Foreign Application Priority Data

Jun. 30, 2011 (CN) .......................... 2011 1 0181682

(51) Int. Cl.
*G01R 19/00* (2006.01)
*H03K 17/30* (2006.01)
*H03K 17/20* (2006.01)
*H02M 1/00* (2007.01)
*H02M 1/32* (2007.01)
*H04B 1/00* (2006.01)
*G01R 31/40* (2014.01)

(52) U.S. Cl.
CPC .................. *H03K 17/30* (2013.01); *H02M 1/00* (2013.01); *H02M 1/32* (2013.01); *H03K 17/20* (2013.01); *G01R 31/40* (2013.01); *G05B 2219/00* (2013.01); *H03K 2017/307* (2013.01); *H04B 1/00* (2013.01)

(58) Field of Classification Search
CPC ............. H02J 1/00; H02M 1/00; H01M 2/00; H01M 2200/00; H04B 1/00; H04B 2201/00; G05B 1/00; G05B 2219/00; G05F 1/00; H01F 1/00

USPC ............. 324/76.11, 429, 525, 713, 714, 723, 324/72.5, 98

See application file for complete search history.

(56) References Cited

U.S. PATENT DOCUMENTS

| | | | | |
|---|---|---|---|---|
| 3,125,718 A | * | 3/1964 | Race | 324/429 |
| 3,876,931 A | * | 4/1975 | Godshalk | 324/429 |
| 4,453,206 A | * | 6/1984 | Voight | 363/19 |
| 4,591,962 A | * | 5/1986 | Schwarz et al. | 363/15 |
| 5,412,303 A | * | 5/1995 | Wernicki | 318/729 |
| 6,114,848 A | * | 9/2000 | Suto et al. | 324/762.01 |
| 6,629,044 B1 | * | 9/2003 | Papallo et al. | 702/60 |
| 8,560,263 B2 | * | 10/2013 | Yamamoto et al. | 702/118 |
| 8,749,222 B2 | * | 6/2014 | Williams | 324/76.11 |
| 2003/0042971 A1 | * | 3/2003 | Oikawa et al. | 327/540 |
| 2004/0105283 A1 | * | 6/2004 | Schie | H02M 1/4225 363/21.12 |
| 2011/0002068 A1 | * | 1/2011 | Hu | H02M 1/32 361/18 |
| 2011/0227497 A1 | * | 9/2011 | Hu | H05B 33/0809 315/224 |

* cited by examiner

*Primary Examiner* — Jay Patidar
*Assistant Examiner* — Temilade Rhodes-Vivour
(74) *Attorney, Agent, or Firm* — Perkins Coie LLP

(57) ABSTRACT

A no-load detecting circuit and the method thereof are disclosed. The no-load detecting circuit may be applied in switching mode power supplies or other circuits. The no-load detecting circuit comprises: a variable resistance circuit coupled in series to a load of the switching mode power supply; and a first comparison circuit coupled to the variable resistance circuit to receive the voltage across the variable resistance circuit, wherein based on the comparison of the voltage across the variable resistance circuit and a first threshold, the first comparison circuit generates a no-load detecting signal indicative of the load status; wherein the equivalent resistance of the variable resistance circuit varies based on the varying of the load of the switching mode power supply.

18 Claims, 12 Drawing Sheets

LOAD DETECTING CIRCUITS AND THE METHOD THEREOF

CROSS-REFERENCE TO RELATED APPLICATION(S)

This application claims priority to and the benefit of Chinese Patent Application No. 201110181682.7, filed Jun. 30, 2011, which is incorporated herein by reference in its entirety.

TECHNICAL FIELD

The present disclosure relates generally to switching mode power supplies, and more particularly but not exclusively to load detecting circuits and the method thereof.

BACKGROUND

As the energy efficiency and environmental protection become increasingly important, the customers expect more and more on the standby efficiency of power supply products. The power supply products today are required to satisfy the Green Energy Standard, for example, BLUE ANGEL, ENERGY STAR and ENERGY 2000 and so on. Thus, many new technologies, like pulse skipping mode, burst mode and off time modulation, are developed to meet the requirement. All theses technologies are applied to control the switching mode power supply working at lower frequency when there is no load (the load current is zero or is almost zero, or the power supply is open) or when the load is very light (the load current is small).

In order to reduce the frequency of the switching mode power supply when there is no load or when the load is light, load detecting methods are needed. The conventional way of detecting the load is to couple a resistor in series to the load, and then compare the voltage across the resistor with a preset threshold to determine whether a no-load state happens. However, the resistance of the resistor is difficult to choose. Because if the resistance is large, the power consumption of the resistor is high when the load is heavy; and if the resistance is small, the voltage across the resistor is too small to detect and may be easily disturbed when the load is light.

The present disclosure pertains to detecting the load of the switching mode power supply, which may be used for frequency control and other power supply applications.

SUMMARY

It is an object of the present disclosure to provide a no-load detecting circuit and the method thereof.

In accomplishing the above and other objects, there has been provided, in accordance with an embodiment of the present disclosure, a no-load detecting circuit comprising: a variable resistance circuit coupled between the switching mode power supply and a load of the switching mode power supply; and a first comparison circuit coupled to the variable resistance circuit to receive the voltage across the variable resistance circuit, wherein based on the comparison of the voltage across the variable resistance circuit and a first threshold, the first comparison circuit generates a no-load detecting signal indicative of the load status; wherein an equivalent resistance of the variable resistance circuit under heavy load status is higher than that under light load status.

There has been provided, in accordance with an embodiment of the present disclosure, a switching mode power supply comprising: a switching circuit providing electrical signals to the load to drive a load; the no-load detecting circuit described in the above paragraph coupled between the switching circuit and the load to provide a no-load detecting signal indicative of the load status to the switching circuit.

There has been provided, in accordance with an embodiment of the present disclosure, a load detecting circuit for a switching mode power supply configured to supply power to a load, wherein the switching mode power supply comprises a switching circuit, and wherein the load detecting circuit comprises: a no-load detecting circuit coupled to the load to detect the load status and to generate a no-load detecting signal indicative of the load status; and a reload detecting circuit configured to supply a current to the load when the no-load detecting signal indicative of the no-load status, and generates a reload determining signal indicating whether the switching circuit is reloaded based on the comparison of the voltage across the load and a third threshold; wherein the switching circuit is shut down when the load detecting signal indicates the no-load status, and is restarted when the reload determining signal indicates the reload status.

In one embodiment, the load detecting circuit further comprises a timing circuit providing a periodic enable signal to the no-load detecting circuit, so that the no-load detecting circuit checks the load status to reduce power consumption periodically.

There has been provided, in accordance with an embodiment of the present disclosure, a switching mode power supply, wherein the switching mode power supply comprises a switching circuit providing electrical signal to drive a load and the above load detecting circuit coupled between the switching circuit and the load.

There has been provided, in accordance with an embodiment of the present disclosure, a load detecting method for a switching mode power supply which provides power to a load, wherein the load detecting method comprises: coupling a first transistor to the load; coupling a second transistor in parallel to the first transistor; turning ON the first transistor and the second transistor; comparing a drain-source voltage of the first transistor to a second threshold to determine whether the load is light, If yes, go to the next step; turning OFF the second transistor; and comparing the drain-source voltage of the first transistor to a first threshold to determine if there is any load, for example, to determine if the load is disconnected from the switching mode power supply.

There has been provided, in accordance with an embodiment of the present disclosure, a load detecting circuit for a switching mode power supply comprising: a first transistor coupled between the switching mode power supply and a load of the switching mode power supply; a second transistor coupled in parallel to the first transistor; a first comparison circuit coupled to the first transistor to receive the drain-source voltage of the first transistor, and then compares the drain-source voltage of the first transistor with a first threshold to determine if a load current is lower than a first current threshold, wherein a light-load status is determined when the load current is lower than the first current threshold; and a second comparison circuit coupled to the first transistor to receive the drain-source voltage of the first transistor, and then compares the drain-source voltage of the first transistor with a second threshold to determine if the load current is lower than the second current threshold, wherein the second current threshold is lower than the first current threshold; wherein when the load current is higher than the second current threshold, the first transistor and the second transistor are both ON, otherwise the first transistor is ON and the second transistor is OFF.

There has been provided, in accordance with an embodiment of the present disclosure, a load detecting circuit for a switching mode power supply, comprising: a first transistor coupled to a load of the switching mode power supply, wherein the drain-source voltage of the first transistor is regulated to a reference voltage; a third transistor having a first terminal coupled to a first terminal of the first transistor, and a control terminal coupled to a control terminal of the first transistor; a first current source coupled to a second terminal of the third transistor; and a first comparison circuit coupled to the first transistor and the third transistor to compare the drain-source voltage of the first transistor with a drain-source voltage of the third transistor, and determines the load status based thereupon.

The use of the same reference label in different drawings indicates the same or like components.

DETAILED DESCRIPTION

In the present disclosure, numerous specific details are provided, such as examples of circuits, components, and methods, to provide a thorough understanding of embodiments of the disclosure. Persons of ordinary skill in the art will recognize, however, that the disclosure can be practiced without one or more of the specific details. In other instances, well-known details are not shown or described to avoid obscuring aspects of the disclosure.

It is to be understood in these letters patent that the meaning of "A" is coupled to "B" is that either A and B are connected to each other as described below, or that, although A and B may not be connected to each other as described below, there is nevertheless a device or circuit that is connected to both A and B. This device or circuit may include active or passive circuit elements, where the passive circuit elements may be distributed or lumped-parameter in nature. For example, A may be connected to a circuit element that in turn is connected to B.

Figure 1:
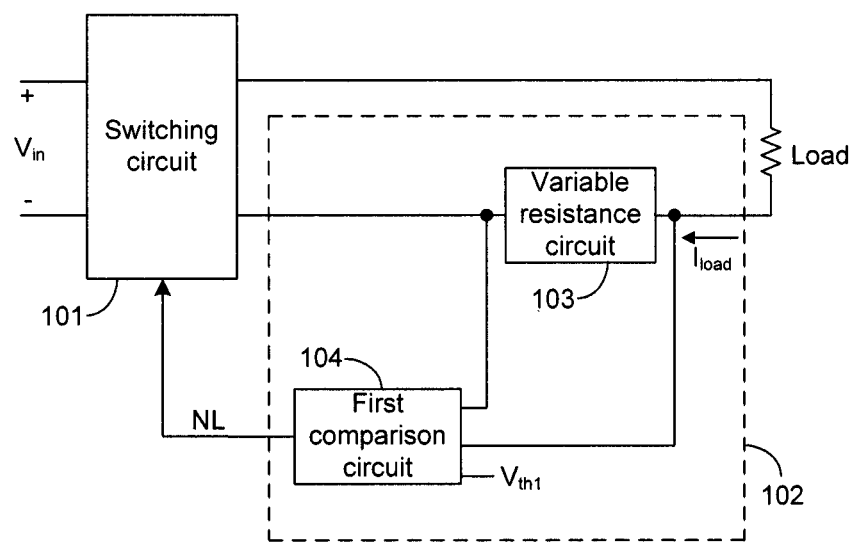
FIG. 1 shows a block diagram of a switching mode power supply in accordance with an embodiment of the present disclosure.

FIG. 1 shows a block diagram of a switching mode power supply in accordance with an embodiment of the present disclosure. The switching mode power supply comprises a switching circuit 101 and a no-load detecting circuit 102. The switching circuit 101 is configured to receive an input voltage Vin, to supply power to a load. The no-load detecting circuit 102 is coupled between the switching circuit 101 and the load. The no-load detecting circuit 102 detects the load status to determine whether the no-load state happens, to provide a no-load detecting signal NL to the switching circuit 101. Persons of ordinary skill in the art should know that any suitable switching circuit, for example, DC/DC converter, AC/DC converter, AC/AC converter or DC/AC converter, with any topology, for example, half-bridge, full-bridge, LLC or flyback and so on, may take advantage of the no-load detecting signal NL without detracting from the merits of the present disclosure.

The no-load detecting circuit 102 comprises a variable resistance circuit 103 and a first comparison circuit 104. The variable resistance circuit 103 is coupled in series to the load of the switching circuit 101, wherein the equivalent resistance of the variable resistance circuit 103 increases as the decrease of the load of the switching circuit 101. Persons of ordinary skill in the art should know that the variable resistance circuit 103 may comprise MOSFET (Metal Oxide Semiconductor Field Effect Transistor), BJT (Bipolar Junction Transistor) device and other controllable semiconductor devices.

The first comparison circuit 104 is coupled to the variable resistance circuit 103 to receive a voltage across the variable resistance circuit 103, and wherein based on the comparison of the voltage across the variable resistance circuit 103 and a first threshold Vth1, the first comparison circuit 104 generates a no-load detecting signal NL indicative of the load status. In one embodiment, when the voltage across the variable resistance circuit 103 is lower than the first threshold Vth1, the no-load detecting signal NL indicates that there is no load. In one embodiment, the switching circuit 101 skips pulses or prolongs the off time to save the power loss when the no-load detecting signal NL indicates the no-load status. In one embodiment, the switching circuit 101 is shutdown when the no-load detecting signal NL indicates the no-load status, and is restarted when the switching circuit 101 is reloaded. In one embodiment, the switching circuit 101 is shut down for a preset time when the no-load detecting signal NL indicates the no-load status.

Because the equivalent resistance of the variable resistance circuit 103 increases as the decrease of the load, the variable resistance circuit 103 saves power loss when the load is heavy and keeps accuracy when the load is light.

Figure 2:
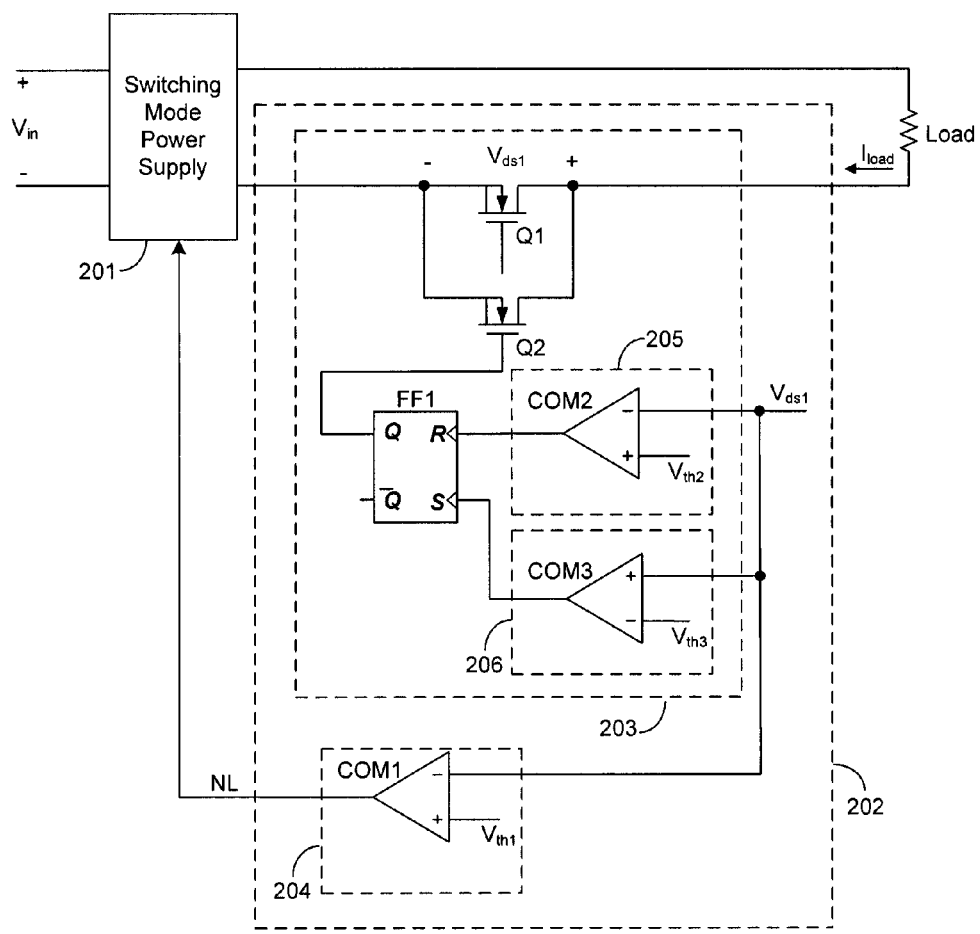
FIG. 2 schematically shows a switching mode power supply comprising a switching circuit 201 and a no-load detecting circuit 202 in accordance with an embodiment of the present disclosure.

FIG. 2 schematically shows a switching mode power supply comprising a switching circuit 201 and a no-load detecting circuit 202 in accordance with an embodiment of the present disclosure. The no-load detecting circuit 202 comprises a variable resistance circuit 203 and a first comparison circuit 204. In one embodiment, the variable resistance circuit 203 comprises a first transistor Q1 and a second transistor Q2, wherein the first transistor Q1 is coupled in series to the load, and the second transistor Q2 is coupled in parallel to the first transistor Q1. In one embodiment, the first transistor Q1 and the second transistor Q2 are both ON under heavy load status, while the first transistor Q1 is ON and the second transistor Q2 is OFF under light load status. The first comparison circuit 204 is coupled to the first transistor Q1 to receive a drain-source voltage Vds1 of the first transistor Q1, wherein based on the comparison of the drain-source voltage Vds1 and the first threshold Vth1, the first comparison circuit 204 generates the no-load detecting signal NL indicative of the load status.

In one embodiment, the transistors Q1 and Q2 comprise NMOS (N-type MOSFET), and the on resistance of the second transistor Q2 is lower than the on resistance of the first transistor Q1. In one embodiment, the on resistance of the first transistor Q1 is ten times larger than the on resistance of the second transistor Q2. In one embodiment, the on resistance of the first transistor Q1 is 50 mΩ, and the on resistance of the second transistor Q2 is 5 mΩ, and the first threshold Vth1 is 50 µV.

In one embodiment, the variable resistance circuit 203 comprises a second comparison circuit 205 coupled to the first transistor Q1 to receive the drain-source voltage Vds1 across the first transistor Q1, and based on the comparison of the voltage Vds1 across the first transistor Q1 with a second threshold Vth2, the second comparison circuit 205 determines the load status. In one embodiment, when the voltage Vds1 is lower than the second threshold Vth2, a light load status is determined.

In one embodiment, the first comparison circuit 204 comprises a comparator COM1, and the second comparison circuit 205 comprises a comparator COM2. The variable resistance circuit 203 further comprises a RS flip-flop FF1. A non-inverting input terminal of the comparator COM1 is configured to receive the first threshold Vth1, and an inverting input terminal of the comparator COM1 is coupled to the first transistor Q1 to receive the drain-source voltage Vds1, and the output terminal of the comparator COM1 provides the no-load detecting signal NL to the switching circuit 201. A non-inverting input terminal of the comparator COM2 is configured to receive the second threshold Vth2, and an inverting input terminal is coupled to the first transistor Q1 to receive the drain-source voltage Vds1. A reset terminal "R" of the RS flip-flop FF1 is coupled to an output terminal of the comparator COM2 and a first output terminal "Q" of the RS flip-flop FF1 is coupled to a gate terminal of the second transistor Q2.

In one embodiment, the variable resistance circuit 203 further comprises a third comparison circuit 206 coupled to the first transistor Q1 to receive the drain-source voltage Vds1 across the first transistor Q1, and to compare the drain-source voltage Vds1 with a third threshold Vth3 to determine whether the load transfers from light load status to heavy load status. In one embodiment, the third comparison circuit 206 comprises a comparator COM3. A non-inverting input terminal of the comparator COM3 is coupled to the first transistor Q1 to receive the drain-source voltage Vds1, and an inverting input terminal of the comparator COM3 is configured to receive the third threshold Vth3, and an output terminal of the comparator COM3 is coupled to a set terminal "S" of the RS flip-flop FF1.

At the beginning of the operation, the transistors Q1 and Q2 are both ON, and the equivalent resistance of the variable resistance circuit 203 is equal to the on resistance of the paralleled transistors Q1 and Q2. In one embodiment, when the load is light, the drain-source voltage Vds1 is lower than the second threshold Vth2, thus the output of the comparator COM2 is logical high. Then the RS flip-flop FF1 is reset and the second transistor Q2 is turned OFF, and the equivalent resistance of the variable resistance circuit 203 is equal to the on resistance of the first transistor Q1. When the voltage Vds1 is lower than the first threshold Vth1, the no-load detecting signal NL is logical high, which indicates the no-load status.

As seen from the above description, the equivalent resistance of the variable resistance circuit 203 is equal to the on resistance of the paralleled transistors Q1 and Q2 under heavy load status, and is equal to the on resistance of the first transistor Q1 under light load status. Thus the variable resistance circuit 203 saves power loss when the load is heavy and keeps accuracy when the load is light.

Persons of ordinary skill in the art should know that the transistors Q1 and Q2 may comprise PMOS (P-type MOSFET). In one embodiment, the transistors Q1 and Q2 may comprise a set of transistors coupled in parallel. In one embodiment, the on resistance of the second transistor Q2 is lower than the on resistance of the first transistor Q1. The first transistor Q1 is turned ON and the second transistor Q2 is turned OFF under light load status, while the first transistor Q1 is turned OFF but the second transistor Q2 is turned ON under heavy load status. In one embodiment, the load status is divided to several levels, for example, very light, light, normal, heavy, very heavy and so on. Correspondingly, the variable resistance circuit 203 may comprise more than two transistors. The combination of the ON and OFF of these transistors induces several resistances corresponding to different load statuses to realize an increasing equivalent resistance of the variable resistance circuit 203 as the load decreases.

Figure 3:
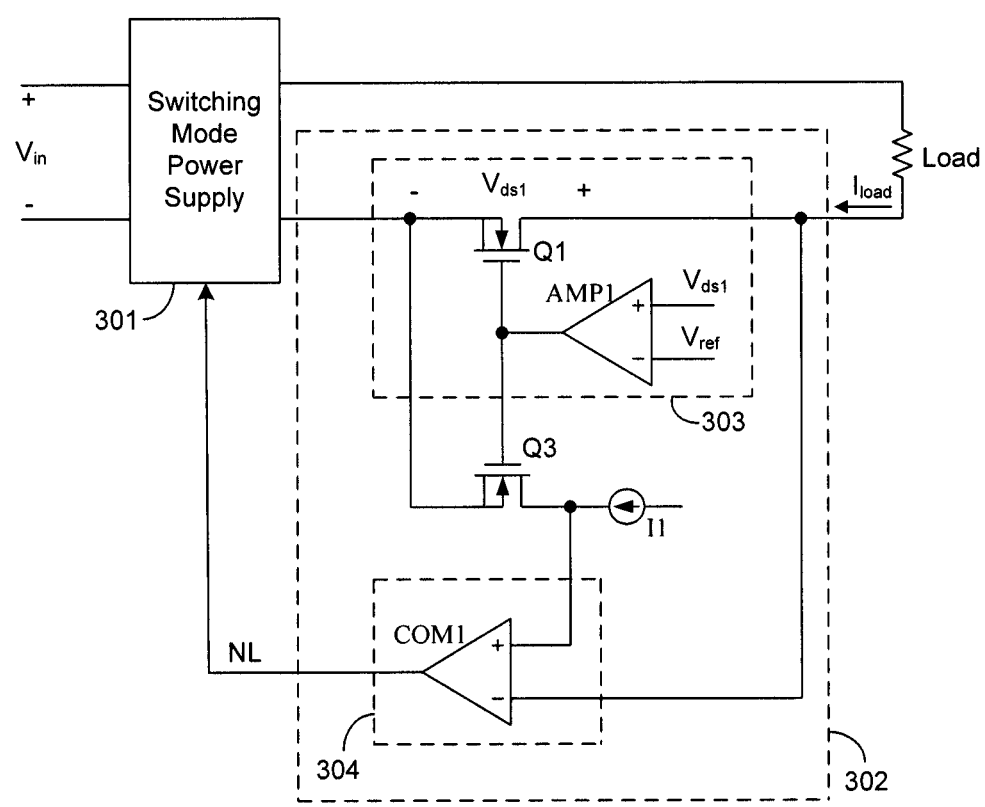
FIG. 3 schematically shows a switching mode power supply comprising a switching circuit 301 and a no-load detecting circuit 302 in accordance with an embodiment of the present disclosure.

FIG. 3 schematically shows a switching mode power supply comprising a switching circuit 301 and a no-load detecting circuit 302 in accordance with an embodiment of the present disclosure. The no-load detecting circuit 302 comprises: a variable resistance circuit 303, a first comparison circuit 304, a third transistor Q3 and a first current source I1. The variable resistance circuit 303 comprises the first transistor Q1 which is in series coupled to the load. The drain-source voltage Vds1 of the first transistor Q1 is regulated to a reference voltage Vref. In one embodiment, the reference voltage Vref may be 50 mV. A gate terminal and a source terminal of the third transistor Q3 are respectively coupled to a gate terminal and a source terminal of the first transistor Q1. The first current source I1 is coupled to a drain terminal of the third transistor Q3 to supply a current with a current value I1 to the third transistor Q3. The first comparison circuit 304 is coupled to the transistors Q1 and Q3 to compare the drain-source voltage Vds1 of the first transistor Q1 with the drain-source voltage Vds3 of the third transistor Q3 which is served as the first threshold Vth1, and based thereupon, the first comparison circuit 304 generates the no-load detecting signal NL indicative of the load status.

In one embodiment, the transistors Q1 and Q3 comprise NMOS. The variable resistance circuit 303 further comprises an amplifier AMP1, and the first comparison circuit 304 comprises the comparator COM1. A non-inverting input terminal of the amplifier AMP1 is configured to receive the drain-source voltage Vds1 across the first transistor Q1, and an inverting input terminal of the amplifier AMP1 is configured to receive the reference voltage Vref, and an output terminal of the amplifier AMP1 is coupled to the gate terminal of the third transistor Q3. The non-inverting input terminal of the comparator COM1 is coupled to the drain terminal of the third transistor Q3 and the inverting input terminal of the comparator COM1 is coupled to the drain terminal of the first transistor Q1. The output terminal of the comparator COM1 provides the no-load detecting signal NL to the switching circuit 301.

The drain-source voltage Vds1 of the first transistor Q1 is regulated to the reference voltage Vref by the amplifier AMP1. When the drain-source voltage Vds1 increases as a load current $I_{load}$ increases, the output signal of the amplifier AMP1 which is coupled to the gate terminals of the first transistor Q1 and the third transistor Q3 increases. As a result, the on resistance of the transistors Q1 decreases. In other words, the on resistance of the first transistor Q1 decreases as the load current $I_{load}$ increases, and increases as the load current $I_{load}$ decreases.

The first transistor Q1 and the third transistor Q3 form a current mirror as the gate terminals and the source terminals of the transistors Q1 and Q3 are respectively coupled together. The ratio of the W/L of the first transistor Q1 to the W/L of the third transistor Q3 is assumed to be n, wherein W is the width of the transistor Q1 or the transistor Q3, and L is the length of the transistor Q1 or the transistor Q3. The current flowing through the first transistor Q1 is the load current $I_{load}$, and the current flowing through the third transistor Q3 is supplied by the first current source I1 which is constant. When the voltage Vds1 across the first transistor Q1 is equal to the voltage Vds3 across the third transistor Q3, the load current $I_{load}$ is n times larger than the current supplied by the current source I1, that is $I_{load}=n\times I1$. Thus Vds1<Vds3 means $I_{load}<n\times I1$. In one embodiment, n=1000, and I1 is designed to have a reasonable value so that the no-load detecting signal NL will be logical high which indicates the no-load status when Vds1<Vds3.

As discussed above, the equivalent resistance of the variable resistance circuit 303 decreases as the load current $I_{load}$ increases, and increases as the load current $I_{load}$ decreases. Meanwhile, the voltage Vds1 across the first transistor Q1 is regulated to a constant reference voltage Vref. Thus the power dissipated by the variable resistance circuit 303 is saved when the load is heavy, and the accuracy of the no-load detecting circuit under light load status is improved.

Figure 4:
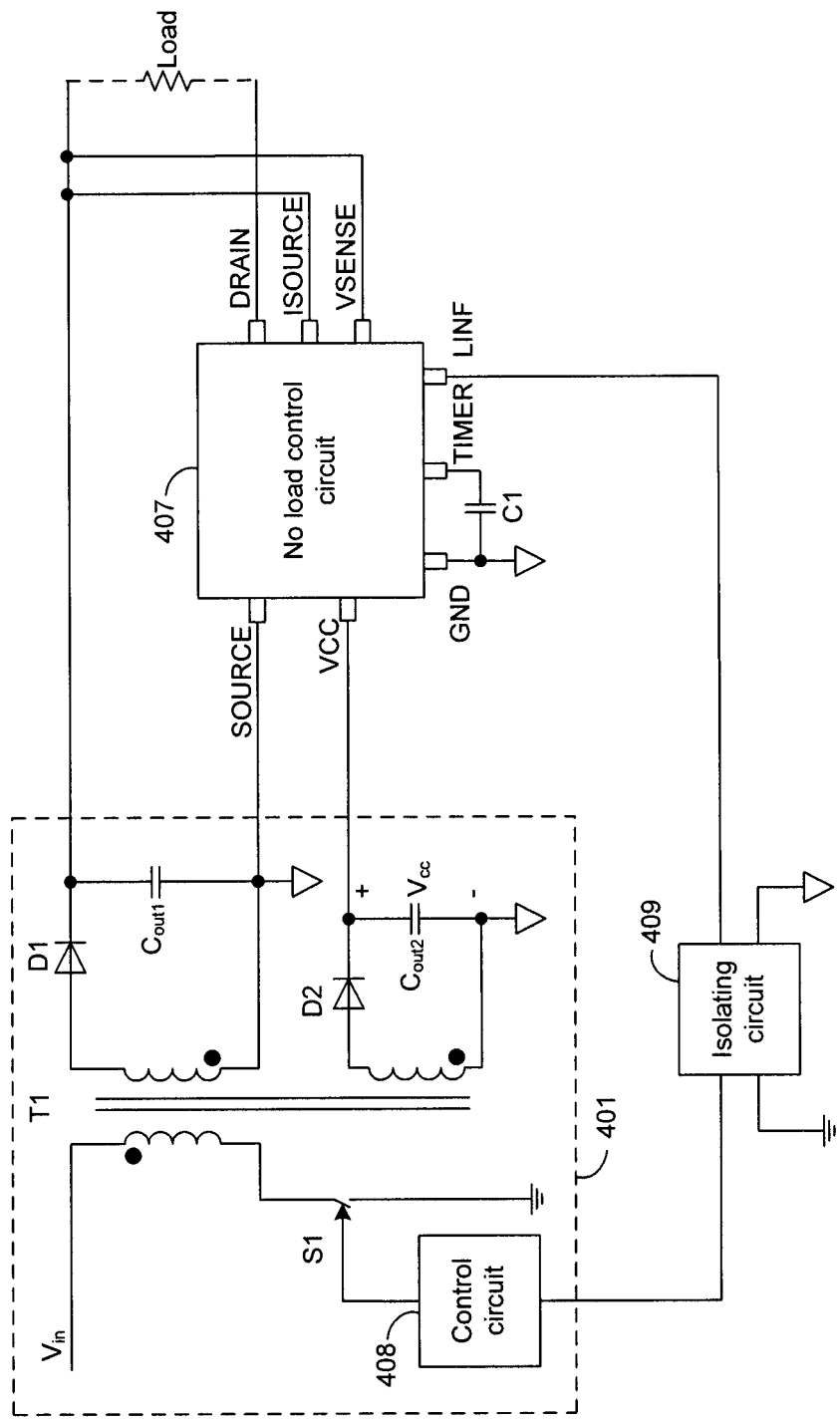
FIG. 4 shows a block diagram of a switching mode power supply comprising a switching circuit 401, an isolation circuit 409 and a load detecting circuit 407 in accordance with an embodiment of the present disclosure.

FIG. 4 shows a block diagram of a switching mode power supply comprising a switching circuit 401, a load detecting circuit 407 and an isolation circuit 409 in accordance with an embodiment of the present disclosure. The switching circuit 401 adopts flyback topology, and comprises a power switch S1, a control circuit 408, a transformer T1, a first diode D1, a second diode D2, a first output capacitor Cout1 and a second output capacitor Cout2.

The transformer T1 comprises a primary winding, a secondary winding and a third winding. A first terminal of the primary winding is configured to receive the input voltage Vin. The power switch S1 is coupled between a second terminal of the primary winding and a primary ground node. An anode of the first diode D1 is coupled to a first terminal of the secondary winding, and a cathode of the first diode D1 is coupled to a first terminal of the first output capacitor Cout1. A second terminal of the first output capacitor Cout1 is coupled to a second terminal of the secondary winding and a secondary ground node. An anode of the second diode D2 is coupled to a first terminal of the third winding, and a cathode of the second diode D2 is coupled to a first terminal of the second output capacitor Cout2. A second terminal of the second output capacitor Cout2 is coupled to a second terminal of the third winding and the secondary ground node. The control circuit 408 is coupled to a gate terminal of the power switch S1 to control the ON and OFF of the power switch S1.

The load detecting circuit 407 is coupled in series to the load with a terminal DRAIN couple to the load and a terminal SOURCE coupled to the secondary winding. The load detecting circuit 407 detects the load status and generates a load determining signal LINF indicative of the load status. The isolation circuit 409 is coupled between the load detecting circuit 407 and the control circuit 408 to transfer the load determining signal LINF to the control circuit 408. When the load determining signal LINF indicates the no-load status, the control circuit 408 shuts down the switching circuit 401 until the load determining signal LINF indicates that the switching circuit 401 is reloaded. In one embodiment, the power switch S1 is turned OFF when the switching circuit 401 is shut down. In one embodiment, there is no power supplied to the control circuit 408 and the power switch S1 is turned OFF when the switching circuit 401 is shut down.

In one embodiment, the switching mode power supply in FIG. 4 is applied in adapters of notebooks. When the adapter is disconnected from the notebook, the load determining signal indicates that there is no load, and then the adapter is shut down. The adapter restarts when the adapter is reconnected to the notebook.

The load detecting circuit 407 comprises terminals SOURCE, VCC, GND, TIMER, LINF, VSENSE, ISOURCE and DRAIN coupled as shown in FIG. 4. A capacitor C1 is coupled between the terminal TIMER and the terminal GND. In one embodiment, the load detecting circuit 407 is integrated in a chip and the terminals of the load detecting circuit 407 are the pins of the chip.

Figure 5:
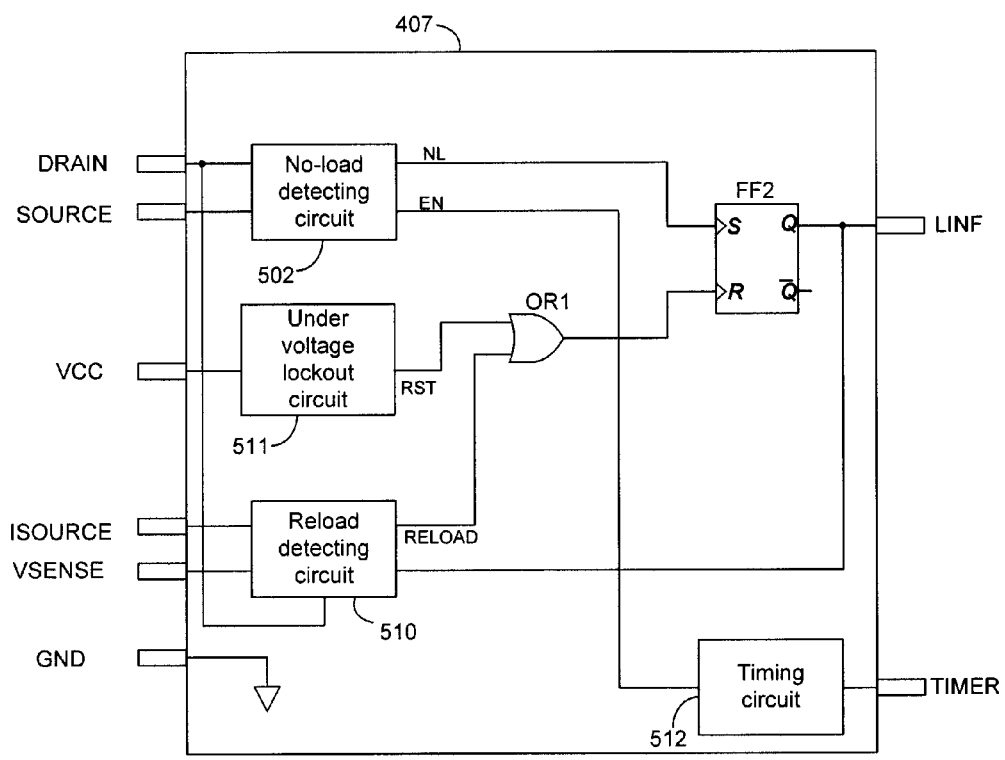
FIG. 5 shows the block diagram of the load detecting circuit 407 of FIG. 4.

FIG. 5 shows a block diagram of the load detecting circuit 407 in FIG. 4. The load detecting circuit 407 comprises a no-load detecting circuit 502, a reload detecting circuit 510 and a RS flip-flop FF2. The no-load detecting circuit 502 is coupled between the switching circuit 401 and the load via the terminals DRAIN and SOURCE to detect the load status. Persons of ordinary skill in the art should know that the no-load detecting circuit 502 could be realized with the conventional circuits or could be realized with the circuits in FIGS. 1 to 3. The first threshold Vth1 in the example of FIG. 2 is too low to realize in applications and may be easily disturbed. The variable range of the on resistance of the first transistor in the example of FIG. 3 is limited. In one embodiment, the no-load detecting circuits in FIGS. 2 and 3 are combined to overcome the above defects.

The reload detecting circuit 510 is configured to supply a current I2, e.g., 1 µA to the load when the no-load detecting signal NL indicates the no-load status. The reload detecting circuit 510 receives the voltage across the load via the terminals VSENSE and DRAIN, and compares the voltage across the load with a threshold Vth4 to generate a reload determining signal RELOAD denoting whether the switching circuit is reloaded. In one embodiment, the value of the threshold Vth4 is 1V. A set terminal "S" of the RS flip-flop FF2 is coupled to the no-load detecting circuit 502 to receive the no-load detecting signal NL, a reset terminal "R" of the RS flip-flop FF2 is coupled to the reload detecting circuit 510 to receive the reload determining signal RELOAD, and wherein based on the no-load detecting signal NL and the reload determining signal RELOAD, the flip-flop FF2 generates a load determining signal LINF at a first output terminal "Q".

In one embodiment, the load detecting circuit 407 further comprises an under voltage lockout circuit 511 and an OR gate OR1. The under voltage lockout circuit 511 is coupled to the cathode of the diode D2 via the terminal VCC to receive an internal power Vcc, and then compares the internal power Vcc with an fifth threshold Vth5, and generates a restart signal RST based thereupon. The OR gate OR1 has a first input terminal, a second input terminal and an output terminal, wherein the first input terminal is coupled to the reload detecting circuit 510 to receive the reload determining signal RELOAD, the second input terminal is coupled to the under voltage lockout circuit 511 to receive the restart signal RST and the output terminal is coupled to the reset terminal "R" of the RS flip-flop FF2. When the internal power Vcc decreases to be lower than the fifth threshold Vth5, the under voltage lockout circuit 511 restores the switching circuit 401 to work properly via the OR gate OR1 and the RS flip-flop FF2.

In one embodiment, the load detecting circuit 407 further comprises a timing circuit 512. The timing circuit 512 provides a periodic enable signal EN to the no-load detecting circuit 502, so that the no-load detecting circuit 502 monitors the load status to reduce power consumption periodically, for example, every second.

Figure 6:
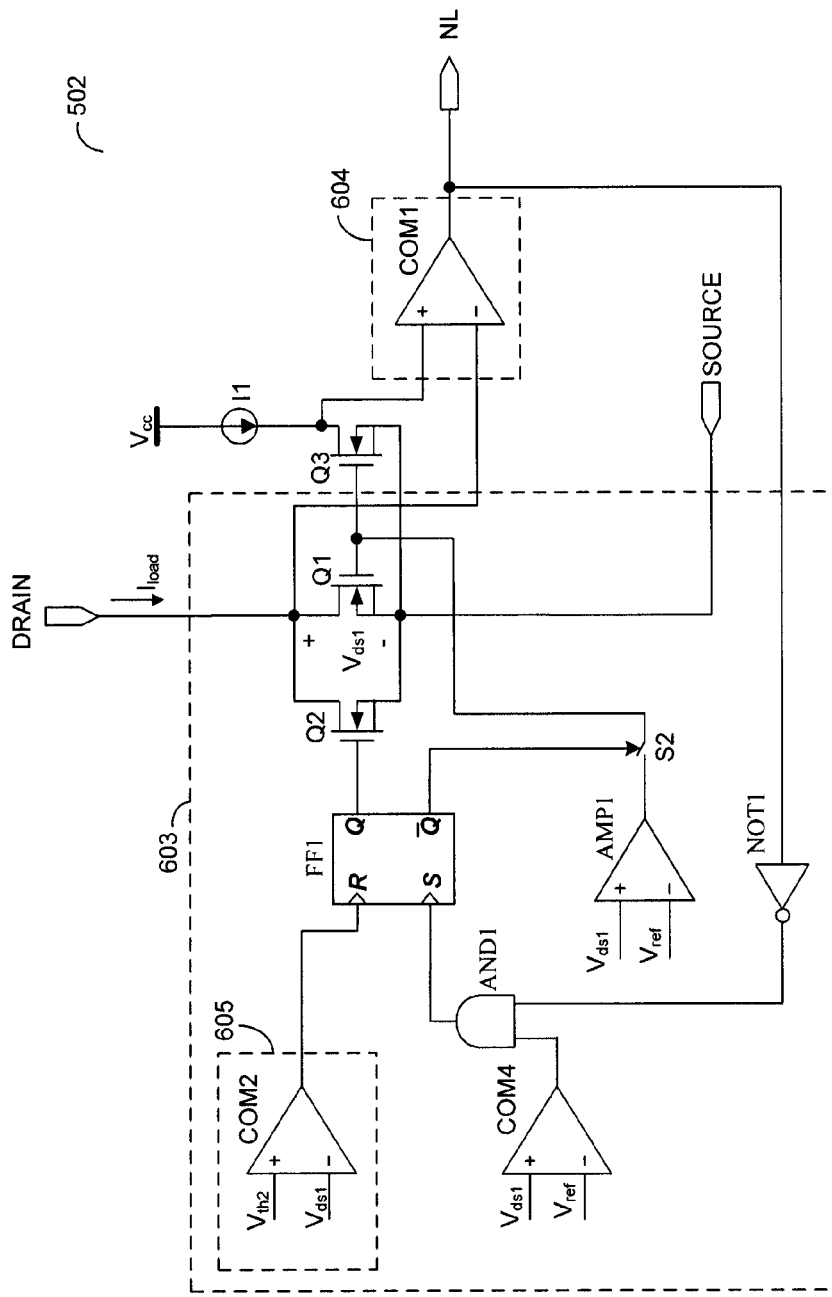
FIG. 6 schematically shows the no-load detecting circuit 502 in accordance with an embodiment of the present disclosure.

FIG. 6 schematically shows the no-load detecting circuit 502 in accordance with an embodiment of the present disclosure. The no-load detecting circuit 502 in FIG. 6 comprises: a variable resistance circuit 603, a first comparison circuit 604, the amplifier AMP1, the third transistor Q3 and the first current source I1. The variable resistance circuit 603 comprises the first transistor Q1 with the gate terminal coupled to the terminal SOURCE and with the drain terminal coupled to the terminal DRAIN, and the second transistor Q2 coupled in parallel to the first transistor Q1. In one embodiment, the on resistance of the second transistor Q2 is lower than the on resistance of the first transistor Q1. In one embodiment, the on resistance of the first transistor Q1 is ten times larger than the on resistance of the second transistor Q2. The gate terminal of the third transistor Q3 is coupled to the gate terminal of the first transistor Q1 and the source terminal of the third transistor Q3 is coupled to the source terminal of the first transistor Q1. Thus the first transistor Q1 and the third transistor Q3 form a current mirror. The current source I1 is coupled to the drain terminal of the third transistor Q3 to supply current with a current value I1 to the third transistor Q3.

In one embodiment, the transistors Q1 and Q2 are both ON under heavy load status; the second transistor Q2 is turned OFF but the first transistor Q1 is still ON under light load status, meanwhile the drain-source voltage Vds1 across the first transistor Q1 is regulated to the reference voltage Vref. The first comparison circuit 604 is coupled to the third transistor Q3 to receive the drain-source voltage Vds1, and compares the drain-source voltage Vds1 with the drain-source voltage Vds3 of the third transistor Q3 which is served as a first threshold Vth1 to generate a no-load detecting signal NL indicative of the load status. In one embodiment, if the drain-source voltage Vds1 is lower than or equal to the drain-source voltage Vds3, the no-load status is determined. Then the transistors Q1, Q2 and Q3 are all turned OFF. If the drain-source voltage Vds1 which is regulated to the reference voltage Vref is still larger than the drain-source voltage Vds3, the no-load status is not detected, and the transistors Q1 and Q2 are turned ON.

In one embodiment, the transistors Q1, Q2 and Q3 comprise NMOS. The drain terminal of the first transistor Q1 is coupled to the load via the terminal DRAIN, and the source terminal of the first transistor Q1 is coupled to the secondary ground node via the terminal SOURCE. The variable resistance circuit 603 further comprises the amplifier AMP1, a second comparison circuit 605, a comparator COM4, the RS flip-flop FF1, a NOT gate NOT1, an AND gate AND1 and a switch S2. The first comparison circuit 604 comprises the comparator COM1, and the second comparison circuit 605 comprises the comparator COM2.

The non-inverting input terminal of the comparator COM1 is coupled to the drain terminal of the third transistor Q3, and the inverting input terminal of the comparator COM1 is coupled to the drain terminal of the first transistor Q1, and the output terminal of the comparator COM1 provides the no-load detecting signal NL. The non-inverting input terminal of the amplifier AMP1 is configured to receive the drain-source voltage Vds1, and the inverting input terminal of the amplifier AMP1 is configured to receive the reference voltage Vref, and the output terminal of the amplifier AMP1 is coupled to the gate terminals of the transistors Q1 and Q3 via the switch S2. The non-inverting input terminal of the comparator COM2 is configured to receive the second threshold Vth2, and the inverting input terminal of the comparator COM2 is configured to receive the drain-source voltage Vds1. A non-inverting input terminal of the comparator COM4 is configured to receive the drain-source voltage Vds1, and an inverting input terminal of the comparator COM4 is configured to receive the reference voltage Vref. A first input terminal of the AND gate AND1 is coupled to the output terminal of the comparator COM1 via the NOT gate NOT1, and a second input terminal of the AND gate AND1 is coupled to the output terminal of the comparator COM4. The reset terminal "R" of the RS flip-flop FF1 is coupled to the output terminal of the comparator COM2, the set terminal "S" of the RS flip-flop FF1 is coupled to the output terminal of the AND gate AND1, the first output terminal "Q" of the RS flip-flop FF1 is coupled to the gate terminal of the second transistor Q2 and a second output terminal "$\overline{Q}$" of the RS flip-flop FF1 is coupled to a gate terminal of the switch S2.

Figure 7:
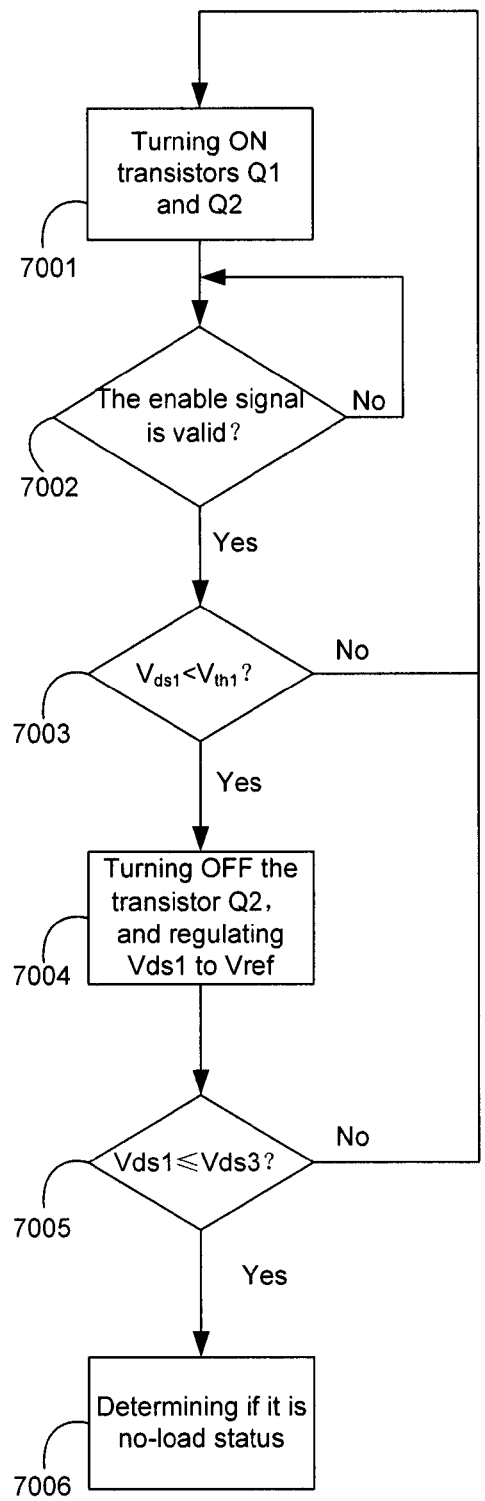
FIG. 7 shows a work flowchart of the no-load detecting circuit 502 in accordance with an embodiment of the present disclosure.
Figure 9:
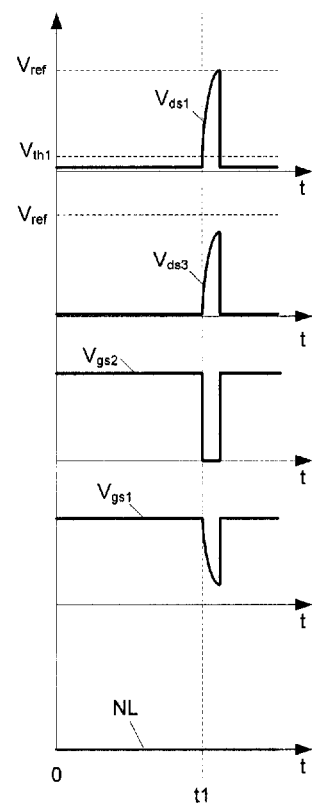
FIG. 9 shows the waveforms of signals in the circuit of FIG. 6 respectively corresponding to a light-load status.
Figure 10:
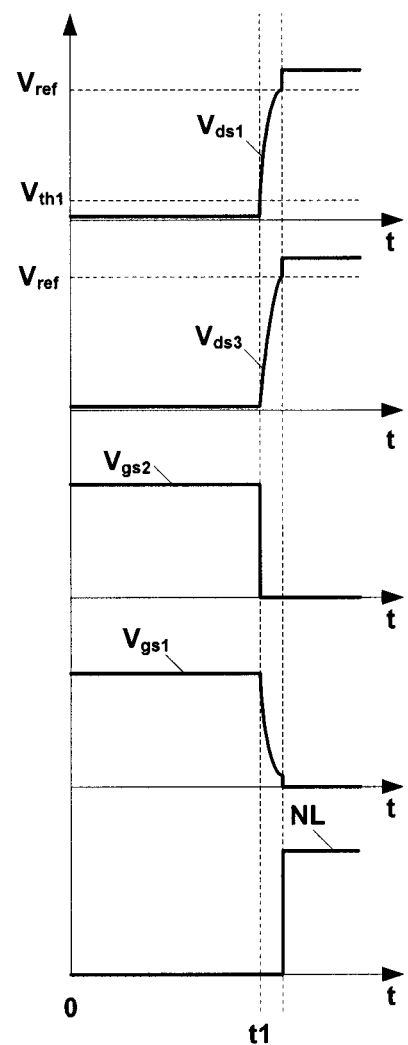
FIG. 10 shows the waveforms of signals in the circuit of FIG. 6 respectively corresponding to a heavy-load status.

FIG. 7 shows a work flowchart of the no-load detecting circuit 502 of FIG. 6 in accordance with an embodiment of the present disclosure. The flowchart comprises steps 7001-7006, wherein:

step 7001, turning ON the transistors Q1 and Q2, so that the equivalent resistance of the variable resistance circuit 603 is equal to the on resistance of the paralleled transistors Q1 and Q2;

step 7002, waiting for the enable signal EN being valid and going to step 7003 if the enable signal EN is valid;

step 7003, determining the load status based on the comparison of the drain-source voltage Vds1 across the first transistor Q1 and the first threshold Vth1: if the drain-source voltage Vds1 is lower than or equal to the first threshold Vth1, which means the load status is light-load status, go to the step 7004, otherwise go back to step 7001;

step 7004, turning OFF the second transistor Q2 and regulating the drain-source voltage Vds1 to the reference voltage Vref (seen FIGS. 9 and 10);

step 7005, comparing the drain-source voltage Vds1 across the first transistor Q1 with the drain-source voltage Vds3 across the third transistor Q3, if the drain-source voltage Vds1 is lower than or equal to the drain-source voltage Vds3, goes to step 7006, otherwise goes back to step 7001;

As seen from the above description, the equivalent resistance of the variable resistance circuit 603 is equal to the on resistance of the paralleled transistors Q1 and Q2 under heavy load status, and is equal to the on resistance of the first transistor Q1 which increases as the load decreases under light load status. Thus the variable resistance circuit 603 saves power loss when the load is heavy and keeps accuracy when the load is light.

Figure 8:
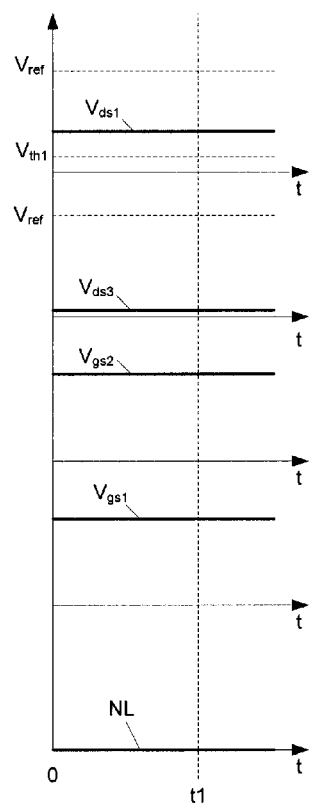
FIG. 8 shows the waveforms of signals in the circuit of FIG. 6 respectively corresponding to a normal-load status.

FIGS. 8~10 show the waveforms of signals in the circuit of FIG. 6 respectively corresponding to a normal load status, the light-load status and the no-load status, wherein Vgs1 and Vgs2 are respectively the waveforms of the gate-source voltages of the transistors Q1 and Q2. During period 0<t<t1, the enable signal EN is invalid, so that the transistors Q1 and Q2 are turned ON and the no-load detecting circuit 502 does not work. At time t=t1, the enable signal EN is valid, then the no-load detecting circuit 502 starts working.

Figure 11:
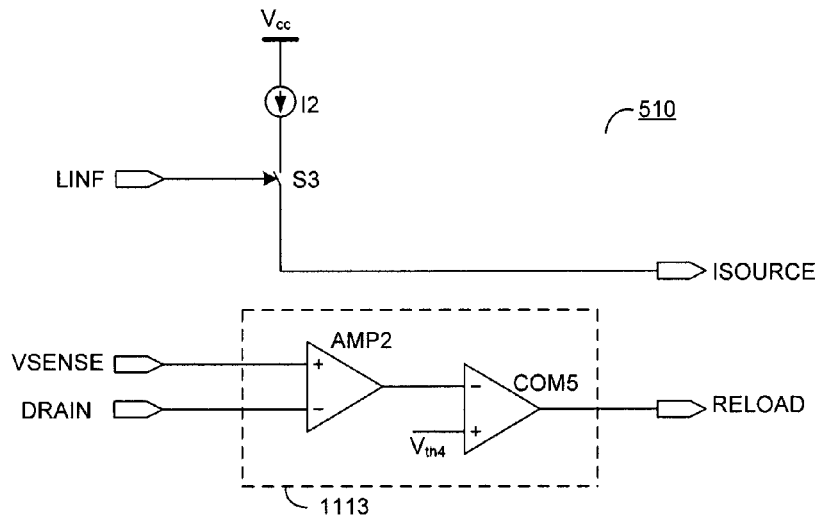
FIG. 11 schematically shows the reload detecting circuit 510 in accordance with an embodiment of the present disclosure.

FIG. 11 schematically shows the reload detecting circuit 510 of FIG. 5 in accordance with an embodiment of the present disclosure. In the example of FIG. 11, the reload detecting circuit 510 comprises: the second current source I2, a switch S3 and a fourth comparison circuit 1113. The first terminal of the second current source I2 is configured to receive the internal power Vcc, and the switch S3 is coupled between the second terminal of the second current source I2 and the load. The switch S3 is controlled by the load determining signal LINF. The second current source I2 is coupled to the load to supply current I2 to the load when the no-load status is detected by the no-load detecting circuit. The fourth comparison circuit 1113 is coupled to the load to receive a voltage across the load, and then compares the voltage across the load with the fourth threshold Vth4 to generate a reload determining signal determining if the switching circuit is reloaded.

In one embodiment, the fourth comparison circuit 1113 comprises an amplifier AMP2 and a comparator COM5. A non-inverting input terminal and an inverting input terminal of the amplifier AMP2 are coupled to the load to receive the voltage across the load. A non-inverting input terminal of the comparator COM5 is configured to receive the fourth threshold Vth4, and an inverting input terminal of the comparator COM5 is coupled to an output of the amplifier AMP2, and the output of the comparator COM5 provides the reload determining signal RELOAD. When the output signal of the amplifier AMP2 is lower than the fourth threshold Vth4, the reload determining signal RELOAD is logical high, which indicates the reloaded status.

Figure 12:
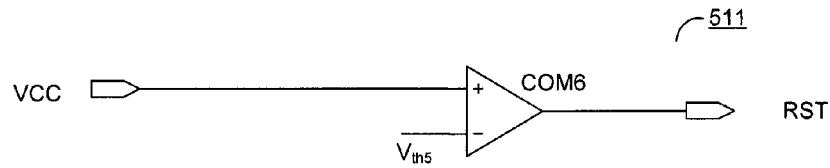
FIG. 12 schematically shows the under voltage lockout circuit 511 in accordance with an embodiment of the present disclosure.

FIG. 12 schematically shows the under voltage lockout circuit 511 of FIG. 5 in accordance with an embodiment of the present disclosure. In the example of FIG. 12, the under voltage lockout circuit 511 comprises a comparator COM6, wherein a non-inverting input terminal of comparator COM6 is configured to receive the fifth threshold Vth5, an inverting input terminal of comparator COM6 is configured to receive the internal power Vcc, and output terminal of comparator COM6 provides the restart signal RST.

Figure 13:
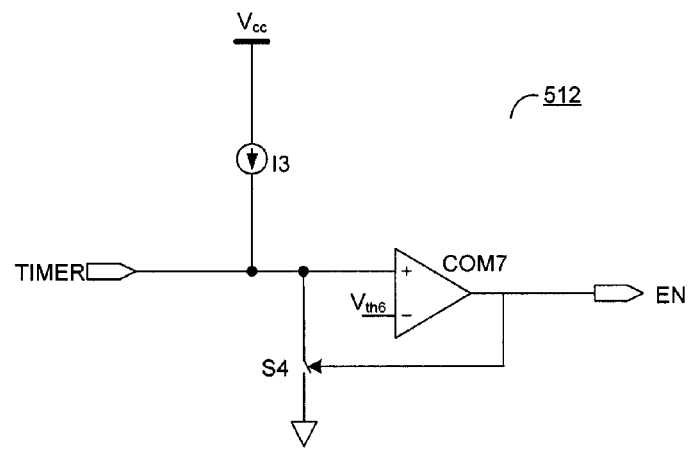
FIG. 13 schematically shows the timing circuit 512 in accordance with an embodiment of the present disclosure.

FIG. 13 schematically shows the timing circuit 512 of FIG. 5 in accordance with an embodiment of the present disclosure. The timing circuit 512 comprises a current source I3, a comparator COM7 and a switch S4. A first terminal of the current source I3 is configured to receive the internal power Vcc, and a second terminal of the current source I3 is coupled to the capacitor C1 via the terminal TIMER. The switch S4 is coupled in parallel to the capacitor C1 via the terminal TIMER. The comparator COMP7 has a non-inverting input terminal, an inverting input terminal and an output terminal, wherein the non-inverting input terminal is coupled to the capacitor C1 via the terminal TIMER, the inverting terminal is configured to receive a threshold Vth6, and the output terminal is coupled to the gate terminal of the switch S4 to provide the enable signal EN to the load detecting circuit 502.

Figure 14:
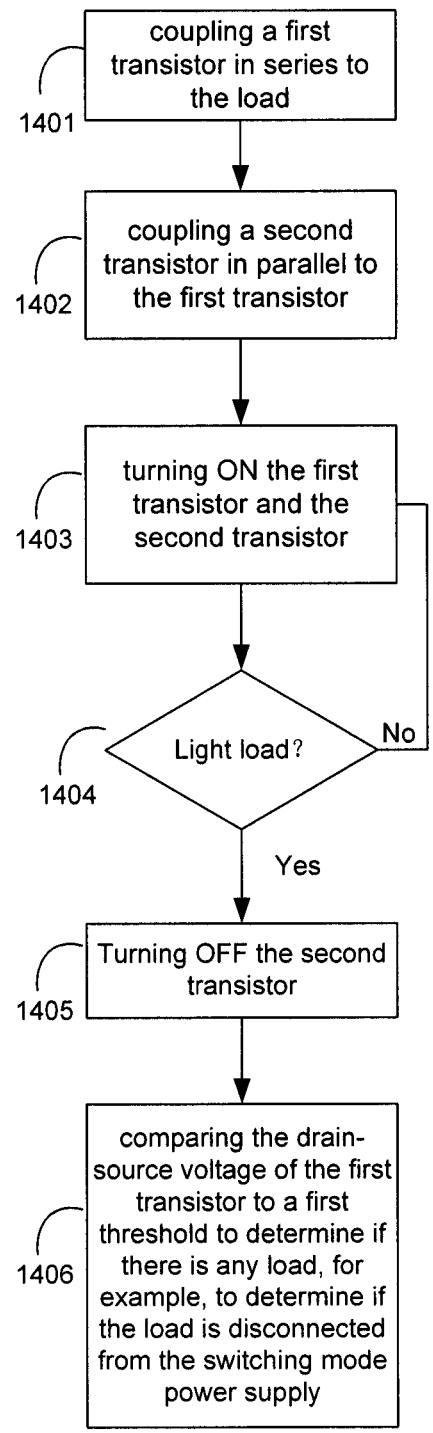
FIG. 14 shows a flowchart of a load detecting method of a switching mode power supply.

FIG. 14 shows a flowchart of a load detecting method of a switching mode power supply, wherein the switching mode power supply comprises a switching circuit providing electrical signals to a load. The load detecting method comprises steps 1401~1406, wherein:

step 1401, coupling a first transistor in series to the load;

step 1402, coupling a second transistor in parallel to the first transistor;

step 1403, turning ON the first transistor and the second transistor;

step 1404, comparing a drain-source voltage of the first transistor to a second threshold to determine if the load is light, If yes, go to step 1405, otherwise repeat step 1404;

step 1405, turning OFF the second transistor;

step 1406, comparing the drain-source voltage of the first transistor to a first threshold to determine if there is any load, for example, to determine if the load is disconnected from the switching mode power supply.

In one embodiment, the load detecting method further comprises: coupling a third transistor to the first transistor, wherein a source terminal of the first transistor and a source terminal of the third transistor are connected together, and a gate terminal of the first transistor and a gate terminal of the third transistor are connected together; supplying a current to a drain terminal of the third transistor; regulating the drain-source voltage across the first transistor to a reference voltage after the second transistor is turned OFF; and comparing the drain-source voltage of the first transistor to a drain-source voltage of the third transistor which is served as the first threshold to determine the load status, wherein if the drain-source voltage across the first transistor is lower than or equal to the drain-source voltage across the third transistor, the load status is no-load status.

In one embodiment, the method further comprises: turning ON the first transistor and the second transistor when the drain-source voltage across the first transistor is still larger than the drain-source voltage across the third transistor after the drain-source voltage across the first transistor is regulated to the reference voltage.

In one embodiment, the method further comprises: shutting down the switching circuit and supplying a current to the load when a no-load status is detected; comparing the voltage across the load with a fourth threshold to determine if the switching circuit is reloaded; and restarting the switching circuit when the switching circuit is reloaded.

Figure 15:
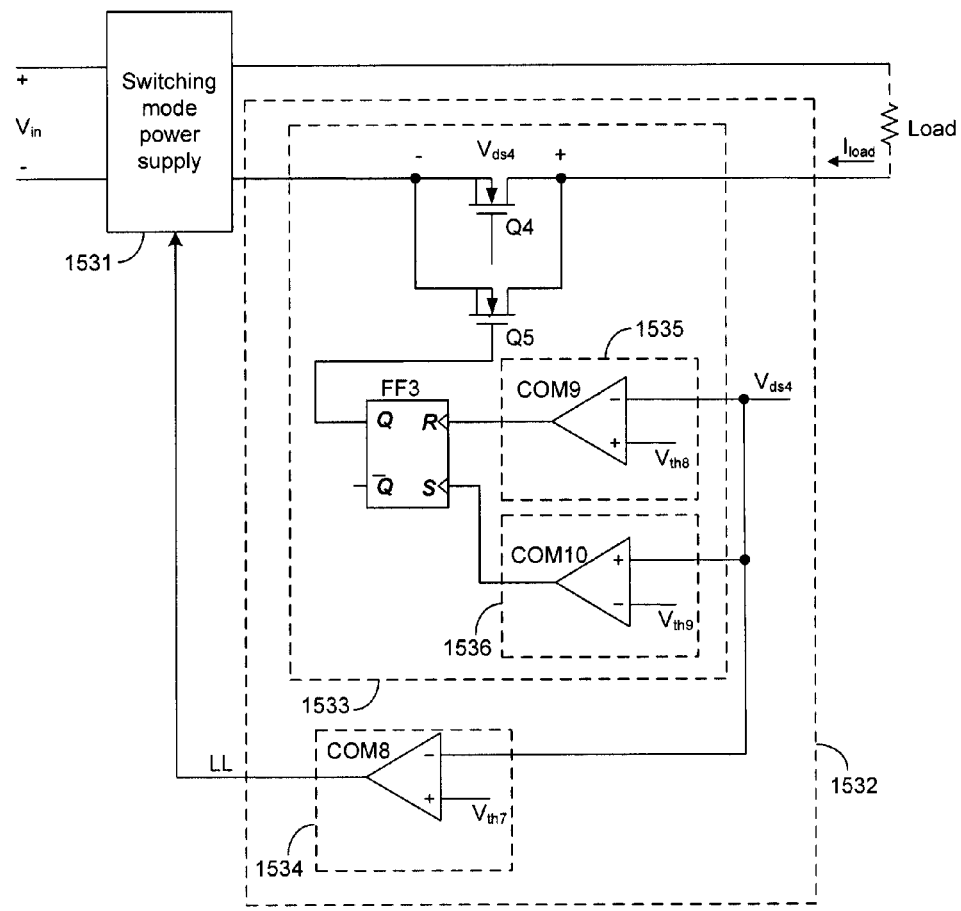
FIG. 15 schematically shows a switching mode power supply in accordance with an embodiment of the present disclosure.

The no-load detecting circuits and the method thereof described above could be applied to detect the load status with other levels. FIG. 15 schematically shows a switching mode power supply in accordance with an embodiment of the present disclosure. Similar to the switching mode power supply in FIG. 2, the switching mode power supply in FIG. 15 comprises a switching circuit 1533 and a load detecting circuit 1532. The load detecting circuit 1532 comprises a variable resistance circuit 1533 and a fifth comparison circuit 1534, wherein the fifth comparison circuit 1534 compares the load current with a first current threshold to determine if the load is light. The variable resistance circuit 1533 is coupled in series to the load, and has an equivalent resistance which increases as the load current decreases. The variable resistance circuit 1533 comprises a transistor Q4 and a transistor Q5. The transistor Q4 is coupled in series to the load, and the transistor Q5 is coupled in parallel to the transistor Q4. When the load current is higher than or equal to a second current threshold, the transistors Q4 and Q5 are turned on; otherwise the transistor Q4 is turned on while the transistor Q5 is turned off, and wherein the second current threshold is larger than the first current threshold. The fifth comparison circuit 1534 is coupled to the transistor Q4, and compares a drain-source voltage Vds4 of the transistor Q4 with a threshold Vth7 to determine if the load current is lower than the first current threshold, and generates a load detecting signal LL.

In one embodiment, the transistors Q4 and Q5 comprise NMOS (N type MOSFET), and the on resistance of the transistor Q5 is lower than the on resistance of the transistor Q4. In one embodiment, the variable resistance circuit 1533 further comprises a sixth comparison circuit 1535. The sixth comparison circuit 1535 is coupled to the transistor Q4, and compares the drain-source voltage Vds4 with a threshold Vth8 to determine if the load current is lower than the second current threshold. In one embodiment, when the drain-source voltage Vds4 is lower than the threshold Vth8, load current is determined to be lower than the second current threshold.

In one embodiment, the fifth comparison circuit 1534 comprises a comparator COM8, and the sixth comparison circuit 1535 comprises a comparator COM9. The variable resistance circuit 1533 further comprises a RS flip-flop FF3. A non-inverting input terminal of the comparator COM8 is configured to receive the threshold Vth7, and an inverting input terminal of the comparator COM8 is coupled to the transistor Q4 to receive the drain-source voltage Vds4, and an output terminal of the comparator COM8 is coupled to the switching circuit 1531 to provide the load detecting signal LL. A non-inverting input terminal of the comparator COM9 is configured to receive the threshold Vth8, and an inverting input terminal of the comparator COM9 is coupled to the transistor Q4 to receive the drain-source voltage Vds4. The RS flip-flop FF3 has a reset terminal "R" coupled to an output terminal of the comparator COM9 and has a first output terminal "Q" coupled to the gate terminal of the transistor Q5.

In one embodiment, the variable resistance circuit 1533 further comprises a seventh comparison circuit 1536. The seventh comparison circuit 1536 compares the drain-source voltage Vds4 with a threshold Vth9 to determine if the load current increases to be higher than the second current threshold. In one embodiment, the seventh comparison circuit 1536 comprises a comparator COM10 having a non-inverting input terminal, an inverting input terminal and an output terminal, wherein the non-inverting input terminal is coupled to the transistor Q4 to receive the drain-source voltage Vds4, the inverting input terminal is configured to receive the threshold Vth9, and the output terminal is coupled to a set terminal "S" of the RS flip-flop FF3.

At the beginning of the operation, the transistors Q4 and Q5 are both ON, and the equivalent resistance of the variable resistance circuit 1533 is equal to the on resistance of the paralleled transistors Q4 and Q5. When the load current is lower than the second current threshold, the drain-source voltage Vds4 is lower than the threshold Vth8, and output signal of the comparator COM9 becomes logical high to reset the RS flip-flop FF3, then the transistor Q5 is turned off. At this time, the equivalent resistance of the variable resistance circuit 1533 is equal to the on resistance of the transistor Q4. The load current is determined to be lower than the first current threshold when the drain-source voltage Vds4 is lower than the threshold Vth7, which means the load is light and the load detecting signal is logical high.

Persons of ordinary skill in the art should know that the transistors Q4 and Q5 may comprise PMOS (P-type MOSFET). In one embodiment, the transistors Q4 and Q5 may comprise a set of transistors coupled in parallel. In one embodiment, the on resistance of the transistor Q5 is lower than the on resistance of the transistor Q4. The transistor Q4 is turned ON and the transistor Q5 is turned OFF when the load current is lower than the second current threshold, while the transistor Q4 is turned OFF and the transistor Q5 is turned ON when the load current is higher than the second current threshold. In one embodiment, the load status is divided to several levels, for example, very light, light, normal, heavy, very heavy and so on. Correspondingly, the variable resistance circuit 203 may comprise more than two transistors. The combination of the ON and OFF of these transistors induces several resistances corresponding to different load statuses to realize an increasing equivalent resistance of the variable resistance circuit 1533 as the load decreases.

Similarly, the no-load detecting circuits in FIGS. 3 and 6 could be applied to detecting the load status of other levels with the reference voltage and the thresholds changed correspondingly.

An effective technique for sample and hold circuit has been disclosed. While specific embodiments of the present disclosure have been provided, it is to be understood that these embodiments are for illustration purposes and not limiting. Many additional embodiments will be apparent to persons of ordinary skill in the art reading this disclosure.

We claim:

1. A no-load detecting circuit for a switching mode power supply, comprising:
   a variable resistance circuit coupled between the switching mode power supply and a load of the switching mode power supply, wherein an equivalent resistance of the variable resistance circuit will vary depending on the status of the load of the switching mode power supply; and
   a first comparison circuit coupled to the variable resistance circuit to receive a voltage across the variable resistance circuit, wherein based on the comparison of the voltage across the variable resistance circuit and a first threshold, the first comparison circuit generates a no-load detecting signal indicative of the load status;
   wherein the variable resistance circuit comprises:
      a first transistor having a first terminal, a second terminal and a control terminal, wherein the first terminal is coupled to the switching mode power supply, and the second terminal is coupled to the load; and
      a second transistor having a first terminal, a second terminal and a control terminal, wherein the second transistor is coupled in parallel to the first transistor;
   and wherein the first transistor is ON and the second transistor is OFF under light load status, and the first transistor and the second transistor are both ON under heavy load status; and
      the first comparison circuit is coupled to the first transistor to receive a drain-source voltage of the first transistor, wherein based on the comparison of the drain-source voltage of the first transistor and the first threshold, the first comparison circuit generates the no-load detecting signal.

2. The no-load detecting circuit of claim 1, wherein the variable resistance circuit further comprises a second comparison circuit coupled to the first transistor to receive the drain-source voltage of the first transistor, wherein the second comparison circuit is configured to compare the drain-source voltage of the first transistor with a second threshold.

3. The no-load detecting circuit of claim 1, further comprising:
   a third transistor having a first terminal, a second terminal and a control terminal, wherein the control terminal is coupled to the control terminal of the first transistor and the first terminal is coupled to the first terminal of the first transistor; and
   a first current source coupled to the second terminal of the third transistor; wherein
      the drain-source voltage of the first transistor is regulated to a reference voltage when the second transistor is turned OFF;
      the first comparison circuit has a first input terminal, a second input terminal and an output terminal, wherein the first input terminal is coupled to the second terminal of the first transistor to receive the voltage at the second terminal of the first transistor, and the second input terminal is coupled to the second terminal of the third transistor to receive the voltage at the second terminal of the third transistor which serves as the first threshold, wherein based on the comparison of the voltage at the second terminal of the first transistor and the voltage at the second terminal of the third transistor, the first comparison circuit generates the no-load detecting signal.

4. The no-load detecting circuit of claim 3, wherein the first transistor and the second transistor are both turned ON when the drain-source voltage of the first transistor is larger than a drain-source voltage of the third transistor.

5. A no-load detecting circuit for a switching mode power supply, comprising:
   a variable resistance circuit coupled between the switching mode power supply and a load of the switching mode power supply, wherein the variable resistance circuit comprises a first transistor having a first terminal, a second terminal and a control terminal, wherein the second terminal is coupled to the load, and wherein a drain-source voltage of the first transistor is configured to be regulated to a reference voltage;
   a third transistor has a first terminal, a second terminal and a control terminal, wherein the control terminal is coupled to the control terminal of the first transistor and the first terminal is coupled to the first terminal of the first transistor;
   a first current source coupled to the second terminal of the third transistor; and
   a first comparison circuit having a first input terminal, a second input terminal and an output terminal, wherein the first input terminal is coupled to the second terminal of the first transistor to receive a voltage at the second terminal of the first transistor, and the second input terminal is coupled to the second terminal of the third transistor to receive a voltage at the second terminal of the third transistor, wherein based on the comparison of the voltage at the second terminal of the first transistor and the voltage at the second terminal of the third transistor, the first comparison circuit generates a no-load detecting signal indicative of the load status.

6. A load detecting circuit for a switching mode power supply configured to supply power to a load, wherein the switching mode power supply comprises a switching circuit, and wherein the load detecting circuit comprises:
   a no-load detecting circuit coupled to the load to detect the load status and to generate a no-load detecting signal indicative of the load status, wherein the no-load detecting circuit comprises:
   (i) a variable resistance circuit coupled to the load; and
   (ii) a first comparison circuit coupled to the variable resistance circuit to receive the voltage across the variable resistance circuit, and based on the comparison of the voltage across the variable resistance circuit and a first threshold, the first comparison circuit generates a no-load detecting signal indicative of the load status: wherein
   (iii) an equivalent resistance of the variable resistance circuit is higher under heavy load status than that under light load status; and
   a reload detecting circuit configured to supply a current to the load when the no-load detecting signal indicates the no-load status, and generates a reload determining signal indicating whether the switching circuit is reloaded based on the comparison of the voltage across the load and a third threshold; wherein
   the switching circuit is shut down when the no-load detecting signal indicates the no-load status, and is restarted when the reload determining signal indicates the reload status.

7. The load detecting circuit of claim 6, wherein the reload detecting circuit comprises:
   a second current source coupled to the load to supply a current to the load when the no-load detecting signal indicates the no-load status;
   a fourth comparison circuit coupled to the load to receive the voltage across the load, to generate the reload determining signal indicative of the load status based on the comparison of the voltage across the load and a fourth threshold.

8. The load detecting circuit of claim 6, wherein the no-load detecting circuit comprises:
   a variable resistance circuit coupled to the load; and
   a first comparison circuit coupled to the variable resistance circuit to receive the voltage across the variable resistance circuit, and based on the comparison of the voltage across the variable resistance circuit and a first threshold, the first comparison circuit generates a no-load detecting signal indicative of the load status; wherein
   an equivalent resistance of the variable resistance circuit is higher under heavy load status than that under light load status.

9. The load detecting circuit of claim 6, wherein the variable resistance circuit comprises:
   a first transistor coupled to the load; and
   a second transistor coupled in parallel to the first transistor; and wherein
   the first transistor is ON and the second transistor is OFF under light load status, and the first transistor and the second transistor are both ON under heavy load status;
   the first comparison circuit is coupled to the first transistor to receive a drain-source voltage of the first transistor, and generates the no-load detecting signal based on the comparison of the drain-source voltage of the first transistor and the first threshold.

10. The load detecting circuit of claim 9, wherein the no-load detecting circuit further comprises a second comparison circuit coupled to the first transistor to receive the drain-source voltage of the first transistor, to compare the drain-source voltage of the first transistor with a second threshold.

11. The load detecting circuit of claim 9, wherein the no-load detecting circuit further comprises:
   a third transistor having a first terminal, a second terminal and a control terminal, wherein the control terminal is coupled to the control terminal of the first transistor and the first terminal is coupled to the first terminal of the first transistor; and
   a first current source coupled to the second terminal of the third transistor; wherein
   the drain-source voltage of the first transistor is regulated to a reference voltage when the second transistor is turned OFF; and
   the first comparison circuit has a first input terminal, a second input terminal and an output terminal, wherein the first input terminal is coupled to the second terminal of the first transistor to receive the voltage at the second terminal of the first transistor, and the second input terminal is coupled to the second terminal of the third transistor to receive the voltage at the second terminal of the third transistor which is served as the first threshold, wherein based on the comparison of the voltage at the second terminal of the first transistor and the voltage at the second terminal of the third transistor, the first comparison circuit generates the no-load detecting signal.

12. The load detecting circuit of claim 11, wherein the first transistor and the second transistor are both turned ON when the drain-source voltage of the first transistor is larger than a drain-source voltage of the third transistor.

13. The load detecting circuit of claim 9, wherein the no-load detecting circuit further comprises a third transistor and a first current source, and wherein:
the variable resistance circuit comprises a first transistor having a first terminal, a second terminal and a control terminal, wherein the second terminal is coupled to the load, and wherein a drain-source voltage of the first transistor is configured to be regulated to a reference voltage;
the third transistor has a first terminal, a second terminal and a control terminal, wherein the control terminal is coupled to the control terminal of the first transistor and the first terminal is coupled to the first terminal of the first transistor;
the first current source is coupled to the second terminal of the third transistor; and wherein
the first comparison circuit has a first input terminal, a second input terminal and an output terminal, wherein the first input terminal is coupled to the second terminal of the first transistor to receive a voltage at the second terminal of the first transistor, and the second input terminal is coupled to the second terminal of the third transistor to receive a voltage at the second terminal of the third transistor which is served as the first threshold, wherein based on the comparison of the voltage at the second terminal of the first transistor and the voltage at the second terminal of the third transistor, the first comparison circuit generates the no-load detecting signal.

14. The load detecting circuit of claim 6, further comprising:
an under voltage lockout circuit configured to receive an internal power of the switching mode power supply, and based on the comparison of the internal power and a fifth threshold, the under voltage lockout circuit generates a restart signal;
an OR gate coupled to the under voltage lockout circuit and the reload detecting circuit to receive the restart signal and the reload determining signal, wherein based on the restart signal and the reload determining signal, the OR gate generates a reload signal; and
a RS flip-flop having a set terminal, a reset terminal and an output signal, wherein the set terminal is configured to receive the no-load detecting signal, the reset terminal is configured to receive the reload signal, and wherein based on the no-load detecting signal and the reload signal, the flip-flop generates a load determining signal at the output terminal.

15. A load detecting method for a switching mode power supply which provides power to a load, wherein the load detecting method comprises:
coupling a first transistor to the load;
coupling a second transistor in parallel to the first transistor;
comparing a drain-source voltage of the first transistor to a second threshold to determine the load status;
turning ON the first transistor and the second transistor when the load is light; and
turning ON the first transistor and turning OFF the second transistor when the load is heavy
coupling a third transistor to the first transistor, wherein a first terminal of the first transistor and a first terminal of the third transistor are connected together, and a control terminal of the first transistor and a control terminal of the third transistor are connected together;
supplying a current to a second terminal of the third transistor;
regulating the drain-source voltage of the first transistor to a reference voltage after the second transistor is turned OFF; and
comparing the drain-source voltage of the first transistor to a drain-source voltage of the third transistor, wherein if the drain-source voltage of the first transistor is lower than or equal to the drain-source voltage of the third transistor, a no-load status is determined.

16. The load detecting method of claim 15 further comprises:
shutting down the switching mode power supply and supplying a current to the load when the no-load detecting signal indicates the no-load status;
comparing the voltage across the load with a fourth threshold to determine whether the switching circuit is reloaded;
restarting the switching mode power supply when the switching circuit is reloaded.

17. The load detecting method of claim 15 further comprises:
coupling a third transistor to the first transistor, wherein a first terminal of the first transistor and a first terminal of the third transistor are connected together, and a control terminal of the first transistor and a control terminal of the third transistor are connected together;
supplying a current to a second terminal of the third transistor;
regulating the drain-source voltage of the first transistor to a reference voltage after the second transistor is turned OFF; and
comparing the drain-source voltage of the first transistor to a drain-source voltage of the third transistor, wherein if the drain-source voltage of the first transistor is lower than or equal to the drain-source voltage of the third transistor, a no-load status is determined.

18. The load detecting method of claim 15 further comprises turning ON the first transistor and the second transistor when the drain-source voltage of the first transistor is larger than the drain-source voltage of the third transistor.

* * * * *